United States Patent
Wong et al.

(10) Patent No.: US 9,634,015 B2
(45) Date of Patent: Apr. 25, 2017

(54) ANTIFUSE-TYPE ONE TIME PROGRAMMING MEMORY CELL AND ARRAY STRUCTURE WITH SAME

(71) Applicant: eMemory Technology Inc., Hsin-Chu (TW)

(72) Inventors: Wei-Zhe Wong, Hsinchu County (TW); Meng-Yi Wu, Hsinchu County (TW); Ping-Lung Ho, Hsinchu (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 0 days.

(21) Appl. No.: 14/980,875

(22) Filed: Dec. 28, 2015

(65) Prior Publication Data
US 2017/0053925 A1 Feb. 23, 2017

Related U.S. Application Data

(60) Provisional application No. 62/206,828, filed on Aug. 18, 2015.

(51) Int. Cl.
*H01L 27/112* (2006.01)
*G11C 17/16* (2006.01)
(Continued)

(52) U.S. Cl.
CPC ........ *H01L 27/11206* (2013.01); *G11C 17/16* (2013.01); *H01L 23/528* (2013.01);
(Continued)

(58) Field of Classification Search
CPC .......... H01L 27/11206; H01L 27/0207; H01L 23/5226; H01L 23/5252; H01L 23/528;
(Continued)

(56) References Cited

U.S. PATENT DOCUMENTS 6,700,151 B2  3/2004 Peng
6,927,997 B2  8/2005 Lee et al.
(Continued)

FOREIGN PATENT DOCUMENTS

TW    457687    10/2001
TW    200816208  4/2008

OTHER PUBLICATIONS

Taiwan Intellectual Property Office "Notice of Allowance" issued on Dec. 27, 2016, Taiwan.
European Patent Office "The extended European search report" issued on Dec. 21, 2016, EPO.

*Primary Examiner* — Charles Garber
*Assistant Examiner* — Brigitte Paterson
(74) *Attorney, Agent, or Firm* — WPAT, PC; Justin King; Douglas Hosack

(57) ABSTRACT

An antifuse-type one time programming memory cell has following structures. A first doped region, a second doped region, a third doped region and a fourth doped region are formed in a well region. A gate oxide layer covers a surface of the well region. A first gate is formed on the gate oxide layer and spanned over the first doped region and the second doped region. The first gate is connected with a word line. A second gate is formed on the gate oxide layer and spanned over the third doped region and the fourth doped region. The second gate is connected with the word line. A third gate is formed on the gate oxide layer and spanned over the second doped region and the third doped region. The third gate is connected with an antifuse control line.

9 Claims, 5 Drawing Sheets

(51) Int. Cl.
*H01L 23/522* (2006.01)
*H01L 23/525* (2006.01)
*H01L 23/528* (2006.01)
*H01L 23/532* (2006.01)
*H01L 27/02* (2006.01)
*H01L 29/10* (2006.01)

(52) U.S. Cl.
CPC ...... *H01L 23/5226* (2013.01); *H01L 23/5252* (2013.01); *H01L 23/53271* (2013.01); *H01L 27/0207* (2013.01); *H01L 29/1095* (2013.01)

(58) Field of Classification Search
CPC ........... H01L 23/53271; H01L 29/1095; H01L 29/0684; H01L 29/0696; H01L 29/0843; H01L 29/0847
See application file for complete search history.

(56) References Cited

U.S. PATENT DOCUMENTS

| | | |
|---|---|---|
| 7,804,714 B1 | 9/2010 | Bu et al. |
| 2003/0206467 A1* | 11/2003 | Peng ...................... G11C 17/16 365/200 |
| 2005/0007804 A1 | 1/2005 | Poechmueller |
| 2005/0101088 A1 | 5/2005 | Scheuerlein et al. |
| 2006/0249809 A1 | 11/2006 | Lung |
| 2007/0076463 A1 | 4/2007 | Keshavarzi et al. |
| 2007/0268742 A1 | 11/2007 | Liu |
| 2015/0076581 A1* | 3/2015 | Lin ................... H01L 27/11206 257/314 |
| 2015/0206595 A1 | 7/2015 | Jeong |
| 2016/0141049 A1* | 5/2016 | Song ...................... G11C 17/16 365/51 |

* cited by examiner

ANTIFUSE-TYPE ONE TIME PROGRAMMING MEMORY CELL AND ARRAY STRUCTURE WITH SAME

This application claims the benefit of U.S. provisional application Ser. No. 62/206,828, filed Aug. 18, 2015, the subject matter of which is incorporated herein by reference.

FIELD OF THE INVENTION

The present invention relates to a non-volatile memory cell, and more particularly to an antifuse-type one time programming memory cell and an array structure with this memory cell.

BACKGROUND OF THE INVENTION

As is well known, a non-volatile memory is able to continuously retain data after the supplied power is interrupted. Generally, after the non-volatile memory leaves the factory, the user may program the non-volatile memory in order to record data into the non-volatile memory.

According to the number of times the non-volatile memory is programmed, the non-volatile memories may be classified into a multi-time programming memory (also referred as a MTP memory), a one time programming memory (also referred as an OTP memory) and a mask read only memory (also referred as a Mask ROM).

Generally, the MTP memory may be programmed many times, and the stored data of the MTP memory may be modified many times. On the contrary, the OTP memory may be programmed once. After the OTP memory is programmed, the stored data fails to be modified. Moreover, after the Mask ROM leaves the factory, all stored data have been recorded therein. The user is only able to read the stored data from the Mask ROM, but is unable to program the Mask ROM.

Moreover, depending on the characteristics, the OTP memories may be classified into two types, i.e. a fuse-type OTP memory and an antifuse-type OTP memory. Before a memory cell of the fuse-type OTP memory is programmed, the memory cell has a low-resistance storage state. After the memory cell of the fuse-type OTP memory is programmed, the memory cell has a high-resistance storage state.

On the other hand, the memory cell of the antifuse-type OTP memory has the high-resistance storage state before programmed, and the memory cell of the antifuse-type OTP memory has the low-resistance storage state after programmed.

With increasing advance of the semiconductor manufacturing process, the process of manufacturing the OTP memory is compatible with the CMOS semiconductor manufacturing process. Since the CMOS semiconductor manufacturing process is continuously in progress, there is a need of providing an improved structure of an OTP memory in order to achieve more reliable performance of the OTP memory.

SUMMARY OF THE INVENTION

The present invention provides a novel antifuse-type one time programming memory cell and an array structure thereof. The antifuse-type one time programming memory cell provides two conduction channels during the program cycle or the read cycle.

An embodiment of the present invention provides an antifuse-type one time programming memory cell. The antifuse-type one time programming memory cell includes a well region, a first doped region, a second doped region, a third doped region, a fourth doped region, a gate oxide layer, a first gate, a second gate, a third gate, and a first metal layer. The first doped region, the second doped region, the third doped region and the fourth doped region are formed in a surface of the well region. The gate oxide layer covers the surface of the well region. The first gate is formed on the gate oxide layer and spanned over the first doped region and the second doped region. The first gate is connected with a word line. The second gate is formed on the gate oxide layer and spanned over the third doped region and the fourth doped region. The second gate is connected with the word line. The third gate is formed on the gate oxide layer and spanned over the second doped region and the third doped region. The third gate is connected with an antifuse control line. The first metal layer is connected with the first doped region through a first via and connected with the fourth doped region through a second via, wherein the first metal layer is a bit line.

Another embodiment of the present invention provides an antifuse-type one time programming memory cell. The antifuse-type one time programming memory cell includes a first select transistor, an antifuse transistor, and a second select transistor. A first drain/source terminal of the first select transistor is connected with a bit line. A gate terminal of the first select transistor is connected with a word line. A first drain/source terminal of the antifuse transistor is connected with a second drain/source terminal of the first select transistor. A gate terminal of the antifuse transistor is connected with an antifuse control line. A first drain/source terminal of the second select transistor is connected with a second drain/source terminal of the antifuse transistor. A gate terminal of the second select transistor is connected with the word line. A second drain/source terminal of the second select transistor is connected with the bit line.

Another embodiment of the present invention provides an array structure. The array structure is connected with a first bit line, a first word line, a second word line, a first antifuse control line and a second antifuse control line. The array structure includes a first memory cell and a second memory cell. The first memory cell includes a first doped region, a second doped region, a third doped region, a fourth doped region, a gate oxide layer, a first gate, a second gate, a third gate and a first metal layer. The first doped region, the second doped region, the third doped region and a fourth doped region are formed in a surface of a well region. The gate oxide layer covers the surface of the well region. The first gate is formed on the gate oxide layer and spanned over the first doped region and the second doped region. The first gate is connected with the first word line. The second gate is formed on the gate oxide layer and spanned over the third doped region and the fourth doped region. The second gate is connected with the first word line. The third gate is formed on the gate oxide layer and spanned over the second doped region and the third doped region. The third gate is connected with the first antifuse control line. The first metal layer is connected with the first doped region through a first via and connected with the fourth doped region through a second via, wherein the first metal layer is the first bit line. The second memory cell includes the fourth doped region, a fifth doped region, a sixth doped region, a seventh doped region, a fourth gate, a fifth gate, a sixth gate and the first metal layer. The fourth doped region, the fifth doped region, the sixth doped region and the seventh doped region are formed in the surface of the well region. The fourth gate is formed on the gate oxide layer and spanned over the fourth doped region and the fifth doped region. The fourth gate is connected with the second word line. The fifth gate is formed on the gate oxide layer and spanned over the sixth doped region and the seventh doped region. The fifth gate is connected with the second word line. The sixth gate is formed on the gate oxide layer and spanned over the fifth doped region and the sixth doped region. The sixth gate is connected with the second antifuse control line. The first metal layer connected with the seventh doped region through a third via.

Another embodiment of the present invention provides an array structure. The array structure is connected with a first bit line, a first word line, a second word line, a first antifuse control line and a second antifuse control line. The array structure includes a first memory cell and a second memory cell. The first memory cell includes a first select transistor, a first antifuse transistor and a second select transistor. A first drain/source terminal of the first select transistor is connected with the first bit line. A gate terminal of the first select transistor is connected with the first word line. A first drain/source terminal of the first antifuse transistor is connected with a second drain/source terminal of the first select transistor. A gate terminal of the first antifuse transistor is connected with the first antifuse control line. A first drain/source terminal of the second select transistor is connected with a second drain/source terminal of the first antifuse transistor. A gate terminal of the second select transistor is connected with the first word line. A second drain/source terminal of the second select transistor is connected with the first bit line. The second memory cell includes a third select transistor, a second antifuse transistor and a fourth select transistor. A first drain/source terminal of the third select transistor is connected with the first bit line. A gate terminal of the third select transistor is connected with the second word line. A first drain/source terminal of the second antifuse transistor is connected with a second drain/source terminal of the third select transistor. A gate terminal of the second antifuse transistor is connected with the second antifuse control line. A first drain/source terminal of the fourth select transistor is connected with a second drain/source terminal of the second antifuse transistor. A gate terminal of the fourth select transistor is connected with the second word line. A second drain/source terminal of the fourth select transistor is connected with the first bit line.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1A:
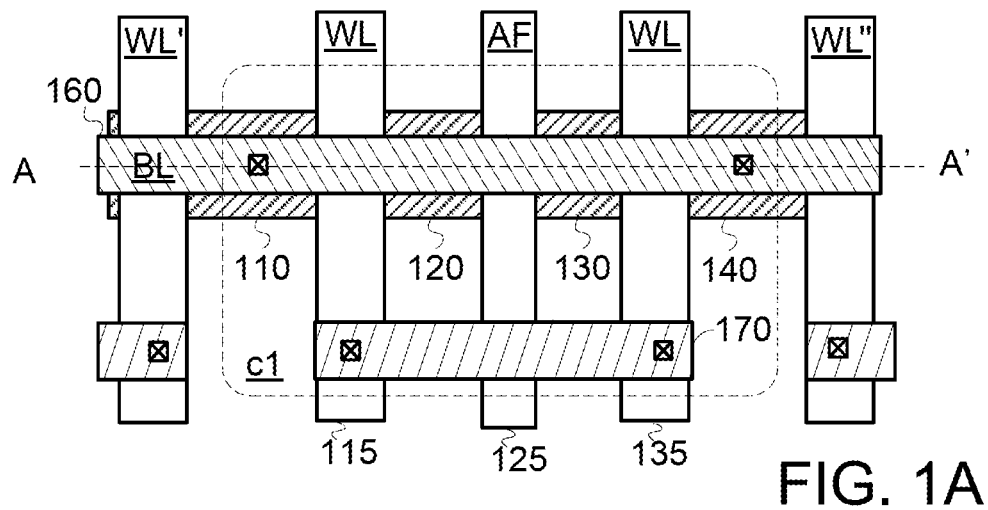
FIG. 1A is a schematic top view of an antifuse-type one time programming memory cell according to a first embodiment of the present invention.
Figure 1B:
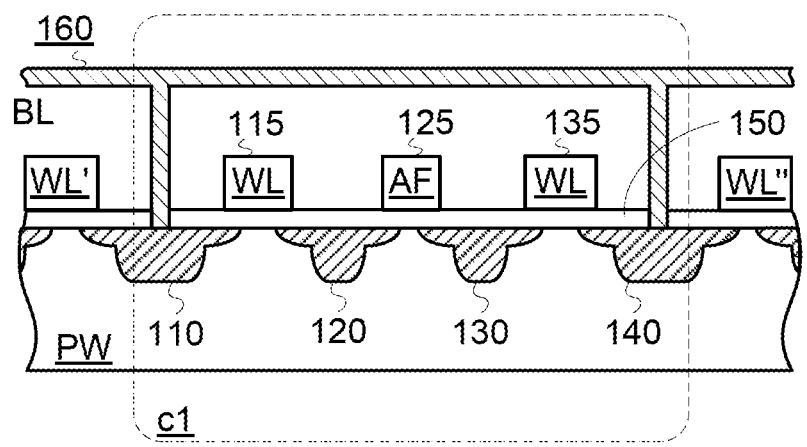
FIG. 1B is a schematic cross-sectional view of the antifuse-type one time programming memory cell of FIG. 1A and taken along a line AA'.
Figure 1C:
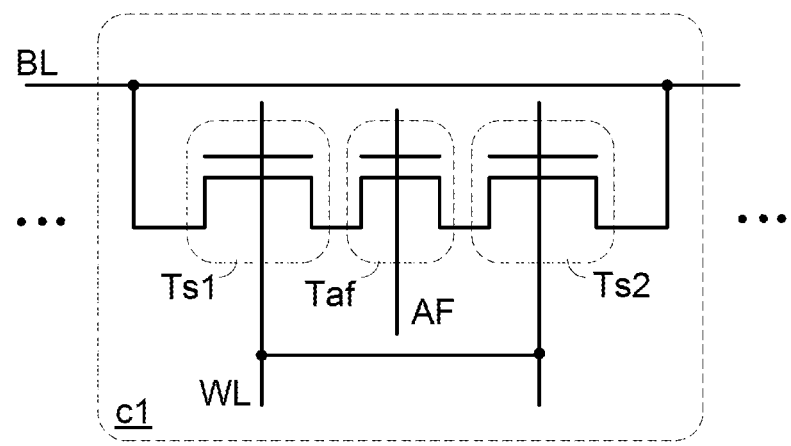
FIG. 1C is a schematic equivalent circuit diagram of the antifuse-type one time programming memory cell according to the first embodiment of the present invention.

FIG. 1A is a schematic top view of an antifuse-type one time programming memory cell according to a first embodiment of the present invention. FIG. 1B is a schematic cross-sectional view of the antifuse-type one time programming memory cell of FIG. 1A and taken along a line AA'. FIG. 1C is a schematic equivalent circuit diagram of the antifuse-type one time programming memory cell according to the first embodiment of the present invention. For brevity, the antifuse-type one time programming memory cell is also referred as an OTP memory cell.

As shown in FIGS. 1A and 1B, the OTP memory cell is constructed in a P-well region PW. A first doped region 110, a second doped region 120, a third doped region 130 and a fourth doped region 140 are formed under a top surface of the P-well region PW. Moreover, a gate oxide layer 150 covers the top surface of the P-well region PW. In this embodiment, the first doped region 110, the second doped region 120, the third doped region 130 and the fourth doped region 140 are N-type doped regions.

A first gate 115 is formed on the gate oxide layer 150 and spanned over the first doped region 110 and the second doped region 120. Moreover, the first gate 115 is connected with a word line WL of the memory cell c1. A second gate 135 is formed on the gate oxide layer 150 and spanned over the third doped region 130 and the fourth doped region 140. The second gate 135 is also connected with the word line WL of the memory cell c1. A third gate 125 is formed on the gate oxide layer 150 and spanned over the second doped region 120 and the third doped region 130. The third gate 125 is connected with an antifuse control line AF of the memory cell c1. In this embodiment, the three gates 115, 125 and 135 are polysilicon gates.

A first metal layer 160 is disposed over the three gates 115, 125 and 135. Moreover, the first metal layer 160 is connected with the first doped region 110 and the fourth doped region 140 through two vias. The first metal layer 160 is used as a bit line BL of the memory cell c1. Moreover, the first gate 115 and the second gate 135 are connected with each other through a second metal layer 170.

Please refer to FIG. 1C. The first doped region 110, the second doped region 120 and the first gate 115 are collaboratively formed as a first select transistor Ts1. The third doped region 130, the fourth doped region 140 and the second gate 135 are collaboratively formed as a second select transistor Ts2. The second doped region 120, the third doped region 130 and the third gate 125 are collaboratively formed as an antifuse transistor Taf.

A first drain/source terminal of the first select transistor Ts1 is connected with the bit line BL. A gate terminal of the first select transistor Ts1 is connected with the word line WL. A first drain/source terminal of the antifuse transistor Taf is connected with a second drain/source terminal of the first select transistor Ts1. A gate terminal of the antifuse transistor Taf is connected with the antifuse control line AF. A first drain/source terminal of the second select transistor Ts2 is connected with a second drain/source terminal of the antifuse transistor Taf. The gate terminal of the second select transistor Ts2 is connected with the word line WL. A second drain/source terminal of the second select transistor Ts2 is connected with the bit line BL.

FIGS. 2A~2D schematically illustrate associated voltage signals for programming and reading the OTP memory cell according to the first embodiment of the present invention.

Figure 2A:
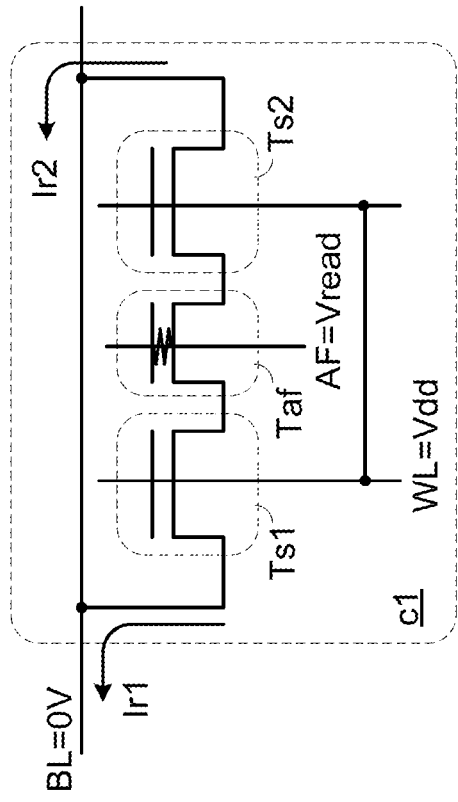
FIGS. 2A~2D schematically illustrate associated voltage signals for programming and reading the OTP memory cell according to the first embodiment of the present invention.

Please refer to FIG. 2A. For programming the OTP cell to a first storing state, a ground voltage (0V) is provided to the bit line BL, a select voltage Vdd is provided to the word line WL, and a first program voltage Vp1 is provided to the antifuse control line AF. In an embodiment, the magnitude of the select voltage Vdd is in the range between 0.75V and 3.6V, and the first program voltage Vp1 is in the range between 4V and 11V.

When the first select transistor Ts1 and the second select transistor Ts2 are turned on in response to the select voltage Vdd applied to the word line WL and the ground voltage applied to the bit line BL, a bias voltage Vp1 is applied to the gate oxide layer of the antifuse transistor Taf. Since the first program voltage Vp1 is beyond the withstanding voltage range of the gate oxide layer, the gate oxide layer of the antifuse transistor Taf is ruptured. The ruptured gate oxide layer may be considered as a resistor with a low resistance value of several tens of ohms. Moreover, the OTP memory cell c1 generates two program currents Ip1 and Ip2. In particular, a first program current Ip1 flows to the bit line BL through the first select transistor Ts1, and a second program Ip2 flow to the bit line BL through the second select transistor Ts2. In other words, a low-resistance resistor is connected between the antifuse control line AF and the two drain/source terminal of the antifuse transistor Taf. Under this circumstance, the OTP memory cell c1 is in the first storing state.

Figure 2C:
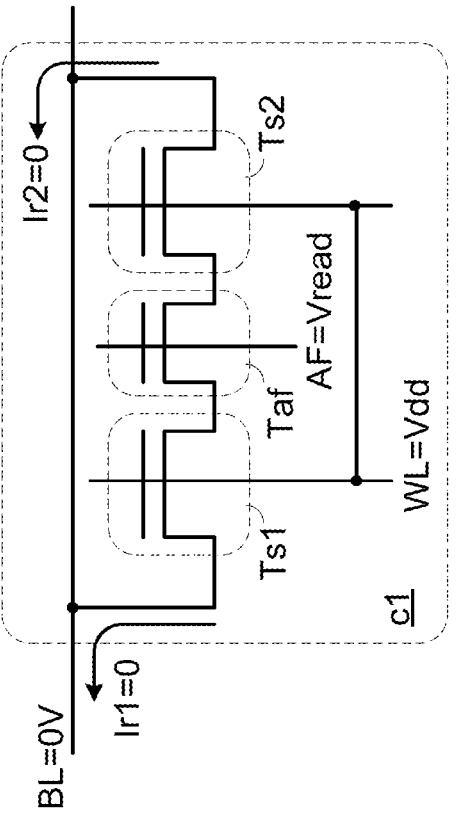
Figure 2B:
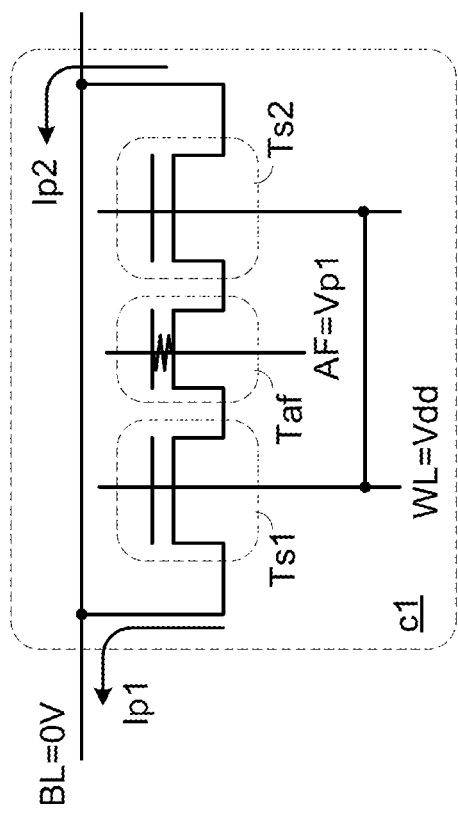

Please refer to FIG. 2B. For programming the OTP cell to a second storing state, a select voltage Vdd is provided to the word line WL and the bit line BL, and the first program voltage Vp1 is provided to the antifuse control line AF. In an embodiment, the magnitude of the select voltage Vdd is in the range between 0.75V and 3.6V, and the first program voltage Vp1 is in the range between 4V and 11V.

When the first select transistor Ts1 and the second select transistor Ts2 are turned off in response to the select voltage Vdd applied to the word line WL and the bit line BL, a bias voltage Vp1 is applied to the gate oxide layer of the antifuse transistor Taf. The gate oxide layer of the antifuse transistor Taf is not ruptured under the bias condition described above. The gate oxide layer that is not ruptured may be considered as a resistor with a high resistance value of several mega ohms. Moreover, the OTP memory cell c1 does not generate the two program currents Ip1 and Ip2. In other words, a high-resistance resistor is connected between the antifuse control line AF and the two drain/source terminal of the antifuse transistor Taf. Under this circumstance, the OTP memory cell c1 is in the second storing state.

During the read cycle, the ground voltage (0V) is provided to the bit line BL, the select voltage Vdd is provided to the word line WL, and a read voltage Vread is provided to the antifuse control line AF. According to the magnitude of a read current flowing through the bit line BL, the OTP memory cell c1 is verified to have the first storing state or the second state. In an embodiment, the magnitude of the select voltage Vdd is in the range between 0.75V and 3.6V, and the read voltage Vread is in the range between 0.75V and 3.6V.

Please refer to FIG. 2C. In this situation, the OTP memory cell c1 is in the first storing state. When the first select transistor Ts1 and the second select transistor Ts2 are turned on in response to the select voltage Vdd, the antifuse transistor Taf generates a first read current Ir1 and a second read current Ir2 in response to the read voltage Vread. The first read current Ir1 flows to the bit line BL through the first select transistor Ts1, and the second read current Ir2 flows to the bit line BL through the second select transistor Ts2. Under this circumstance, the total current flowing through the bit line BL is equal to Ir1+Ir2, and the magnitude of the total current is several microamperes.

Figure 2D:
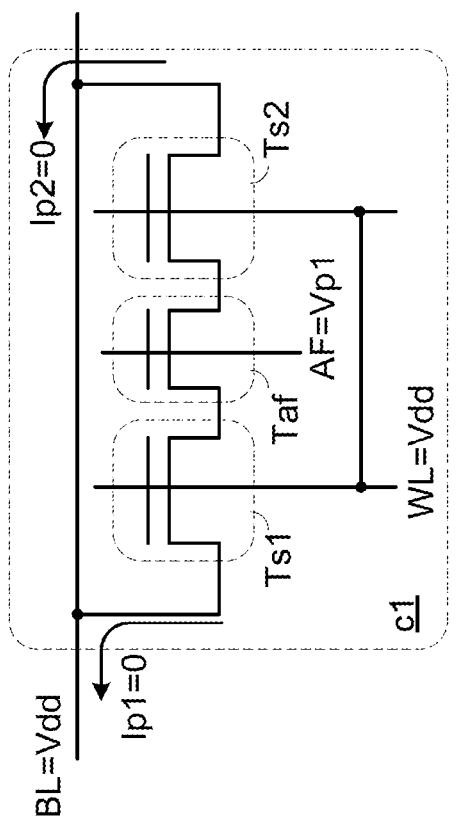

Please refer to FIG. 2D. In this situation, the OTP memory cell c1 is in the second storing state. When the first select transistor Ts1 and the second select transistor Ts2 are turned on in response to the select voltage Vdd, the antifuse transistor Taf generates a first read current Ir1 and a second read current Ir2 in response to the read voltage Vread. The magnitudes of the first read current Ir1 and the second read current Ir2 are nearly zero. Under this circumstance, the total current flowing through the bit line BL is nearly zero (e.g., much lower than one microampere).

In other words, during the read cycle, the OTP cell c1 is judged to have the first storing state or the second storing state according to the magnitude of the current flowing through the bit line BL.

In this embodiment, the OTP cell c1 provides two conduction channels during the program cycle or the read cycle. Consequently, the probability of successfully programming the OTP cell c1 and the probability of reading the OTP cell c1 are both enhanced.

It is noted that numerous modifications and alterations may be made while retaining the teachings of the invention. For example, during the process of manufacturing the OTP cell c1, the gate oxide layer of the antifuse transistor Taf is etched. Consequently, the gate oxide layer of the antifuse transistor Taf is thinner than the gate oxide layer of each of the two select transistors. Under this circumstance, the probability of successfully programming the OTP cell c1 is further increased.

In the OTP cell c1 of FIG. 1A, the first gate 115 and the second gate 135 are connected with each other through the second metal layer 170. Alternatively, in another embodiment, the first gate 115 and the second gate 135 are connected with each other through a polysilicon layer during the process of forming the first gate 115 and the second gate 135.

Figure 3:
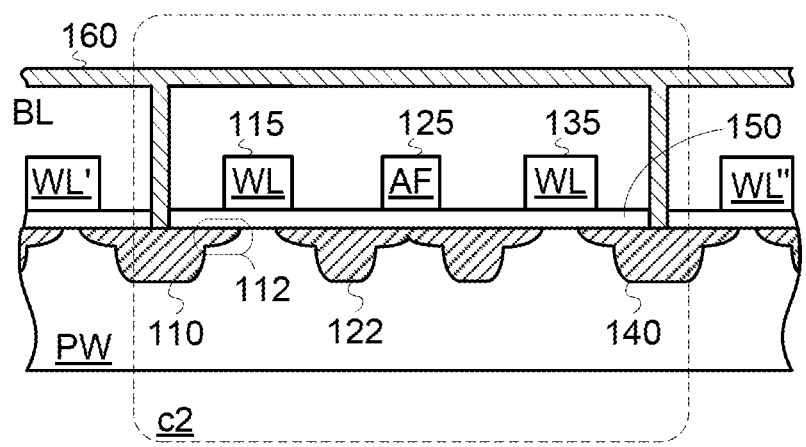
FIG. 3 is a schematic cross-section view of an antifuse-type one time programming memory cell according to a second embodiment of the present invention.

FIG. 3 is a schematic cross-section view of an antifuse-type one time programming memory cell according to a second embodiment of the present invention. In comparison with the first embodiment, the OTP memory cell c2 of this embodiment comprises a merged doped region 122.

During a CMOS semiconductor manufacturing process, a lightly doped drain (LDD) structure is formed in the doped region. As shown in FIG. 3, a LDD structure 112 is formed in the first doped region 110.

In the OTP memory cell c2 of this embodiment, the second doped region and the third doped region are close to each other. Consequently, the LDD structure of the second doped region and the LDD structure of the third doped region are overlapped with each other to form the merged doped region 122. To make the LDD structure of the second doped region and the LDD region of the third region overlapped may be achieved by changing original LDD implant (e.g. core LDD implant) to LDD implant with deeper depth (e.g. I/O LDD implant).

The procedures of programming and reading the OTP memory cell c2 are similar to those of the first embodiment, and are not redundantly described herein.

Figure 4A:
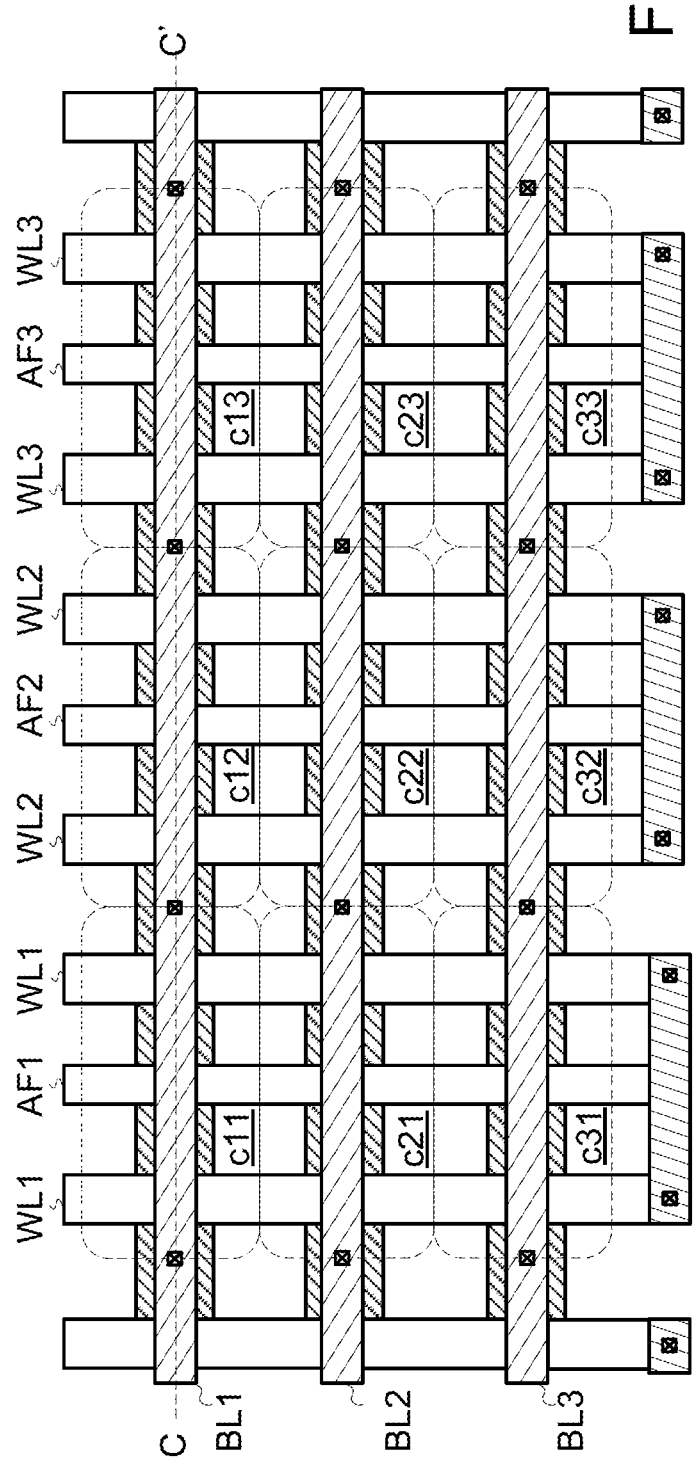
FIG. 4A is a schematic top view illustrating an array structure of OTP memory cells according to an embodiment of the present invention.
Figure 4B:
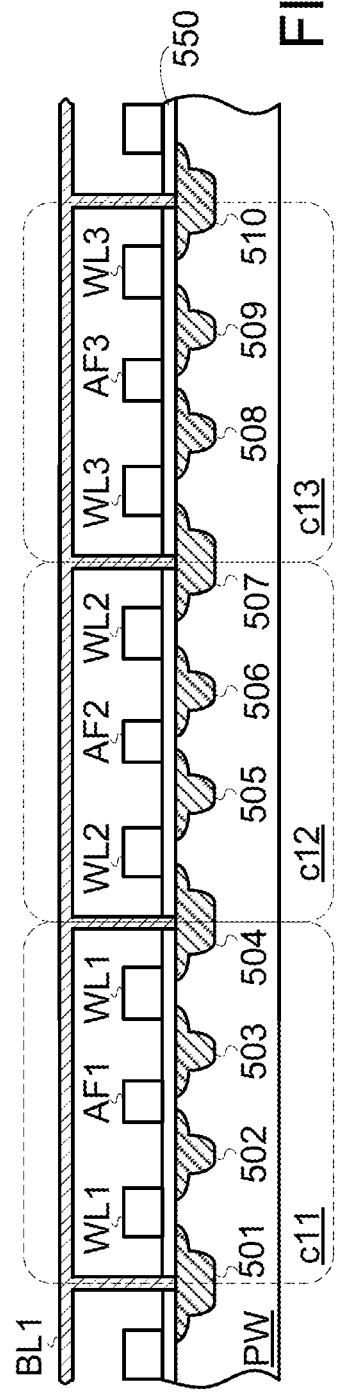
FIG. 4B is a schematic cross-sectional view illustrating the array structure of OTP memory cells of FIG. 4A and taken along the line CC'.
Figure 4C:
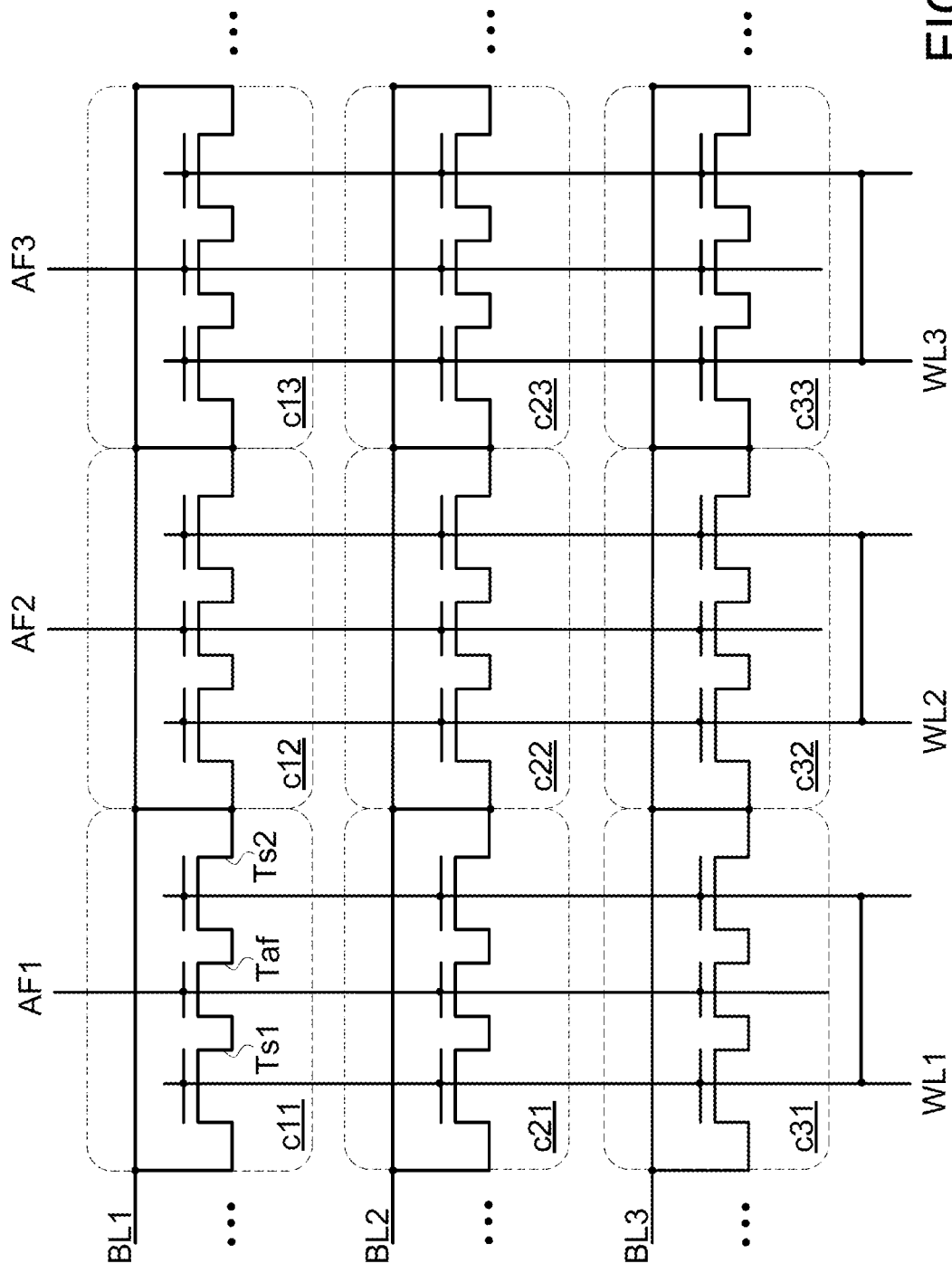
FIG. 4C is a schematic equivalent circuit diagram of the array structure of FIG. 4A.

FIG. 4A is a schematic top view illustrating an array structure of OTP memory cells according to an embodiment of the present invention. FIG. 4B is a schematic cross-sectional view illustrating the array structure of OTP memory cells of FIG. 4A and taken along the line CC'. FIG. 4C is a schematic equivalent circuit diagram of the array structure of FIG. 4A.

As shown in FIGS. 4A and 4B, the array structure comprises OTP memory cells c11~c33 in a 3×3 array. The OTP memory cells c11~c33 can be the OTP memory cells of the first embodiment or the OTP memory cells of the second embodiment. In this embodiment, the OTP memory cells c11, c12 and c13 in the first row are connected with a first bit line BL1, the OTP memory cells c21, c22 and c23 in the second row are connected with a second bit line BL2, and the OTP memory cells c31, c32 and c33 in the third row are connected with a third bit line BL3.

The three OTP memory cells c11, c12 and c13 are constructed in a P-well region PW. Ten doped regions 501~510 are formed under a top surface of the P-well region PW. Moreover, a gate oxide layer 550 covers the top surface of the P-well region PW. In this embodiment, the ten doped regions 501~510 are N-type doped regions.

The structure of the OTP memory cell c11 will be illustrated as follows. A first gate is formed on the gate oxide layer 550 and spanned over the first doped region 501 and the second doped region 502. Moreover, the first gate is connected with a first word line WL1 of the memory cell c11. A second gate is formed on the gate oxide layer 550 and spanned over the third doped region 503 and the fourth doped region 504. The second gate is also connected with the first word line WL1 of the memory cell c11. A third gate is formed on the gate oxide layer 550 and spanned over the second doped region 502 and the third doped region 503. The third gate is connected with a first antifuse control line AF1 of the memory cell c11.

The structure of the OTP memory cell c12 will be illustrated as follows. A first gate is formed on the gate oxide layer 550 and spanned over the fourth doped region 504 and the fifth doped region 505. Moreover, the first gate is connected with a second word line WL2 of the memory cell c12. A second gate is formed on the gate oxide layer 550 and spanned over the sixth doped region 506 and the seventh doped region 507. The second gate is also connected with the second word line WL2 of the memory cell c12. A third gate is formed on the gate oxide layer 550 and spanned over the fifth doped region 505 and the sixth doped region 506. The third gate is connected with a second antifuse control line AF2 of the memory cell c12.

That is, the fourth doped region 504 is shared by the OTP memory cell c11 and the OTP memory cell c12. Since the fourth doped region 504 is shared by the OTP memory cell c11 and the OTP memory cell c12, it is not necessary to form a shallow trench isolation structure to isolate the OTP memory cell c11 from the OTP memory cell c12.

The structure of the OTP memory cell c13 will be illustrated as follows. A first gate is formed on the gate oxide layer 550 and spanned over the seventh doped region 507 and the eighth doped region 508. Moreover, the first gate is connected with a third word line WL3 of the memory cell c13. A second gate is formed on the gate oxide layer 550 and spanned over the ninth doped region 509 and the tenth doped region 510. The second gate is also connected with the third word line WL3 of the memory cell c13. A third gate is formed on the gate oxide layer 550 and spanned over the eighth doped region 508 and the ninth doped region 509. The third gate is connected with a third antifuse control line AF3 of the memory cell c13.

Similarly, the seventh doped region 507 is shared by the OTP memory cell c12 and the OTP memory cell c13. Since the seventh doped region 507 is shared by the OTP memory cell c12 and the OTP memory cell c13, it is not necessary to form a shallow trench isolation structure to isolate the OTP memory cell c12 from the OTP memory cell c13.

The structures of the OTP memory cells c21~c23 and the structures of the OTP memory cells c31~c33 are similar to the structures of the OTP memory cells c11~c13, and are not redundantly described herein.

Please refer to FIG. 4C. The OTP memory cell c11 comprises a first select transistor Ts1, a second select transistor Ts2 and an antifuse transistor Taf. A first drain/source terminal of the first select transistor Ts1 is connected with the first bit line BL1. A gate terminal of the first select transistor Ts1 is connected with the first word line WL1. A first drain/source terminal of the antifuse transistor Taf is connected with a second drain/source terminal of the first select transistor Ts1. A gate terminal of the antifuse transistor Taf is connected with a first antifuse control line AF1. A first drain/source terminal of the second select transistor Ts2 is connected with a second drain/source terminal of the antifuse transistor Taf. The gate terminal of the second select transistor Ts2 is connected with the first word line WL1. A second drain/source terminal of the second select transistor Ts2 is connected with the first bit line BL1.

The structures of the other OTP memory cells are similar to the structure of the OTP memory cell c11. The OTP memory cell c12 is connected with the second word line WL2, the second antifuse control line AF2 and the first bit line BL1. The OTP memory cell c13 is connected with the third word line WL3, the third antifuse control line AF3 and the first bit line BL1. The OTP memory cell c21 is connected with the first word line WL1, the first antifuse control line AF1 and the second bit line BL2. The OTP memory cell c22 is connected with the second word line WL2, the second antifuse control line AF2 and the second bit line BL2. The OTP memory cell c23 is connected with the third word line WL3, the third antifuse control line AF3 and the second bit line BL2. The OTP memory cell c31 is connected with the first word line WL1, the first antifuse control line AF1 and the third bit line BL3. The OTP memory cell c32 is connected with the second word line WL2, the second antifuse control line AF2 and the third bit line BL3. The OTP memory cell c33 is connected with the third word line WL3, the third antifuse control line AF3 and the third bit line BL3.

From the above descriptions, the present invention provides an antifuse-type one time programming memory cell and an array structure thereof. The OTP memory cell comprises two select transistors and one antifuse transistor. Moreover, the OTP cell provides two conduction channels during the program cycle or the read cycle. Consequently, the probability of successfully programming the OTP cell and the probability of reading the OTP cell are both enhanced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An antifuse-type one time programming memory cell, comprising:
   a well region;
   a first doped region, a second doped region, a third doped region and a fourth doped region formed in a surface of the well region, wherein the second doped region is completely separated from the third doped region by the well region;
   a gate oxide layer covering the surface of the well region;
   a first gate formed on the gate oxide layer and spanned over the first doped region and the second doped region, wherein the first gate is connected with a word line;
   a second gate formed on the gate oxide layer and spanned over the third doped region and the fourth doped region, wherein the second gate is connected with the word line;
   a third gate formed on the gate oxide layer and spanned over the second doped region and the third doped region, wherein the third gate is connected with an antifuse control line; and
   a first metal layer connected with the first doped region through a first via and connected with the fourth doped region through a second via, wherein the first metal layer is a bit line.

2. The antifuse-type one time programming memory cell as claimed in claim 1, wherein the gate oxide layer under the third gate is thinner than the gate oxide layer under the first gate, and the gate oxide layer under the third gate is thinner than the gate oxide layer under the second gate.

3. The antifuse-type one time programming memory cell as claimed in claim 1, further comprising a second metal layer, wherein the first gate and the second gate are connected with each other through the second metal layer.

4. The antifuse-type one time programming memory cell as claimed in claim 1, wherein the first gate and the second gate are connected with each other through a polysilicon layer.

5. An array structure connected with a first bit line, a first word line, a second word line, a first antifuse control line and a second antifuse control line, the array structure comprising:
   a first memory cell comprising:
      a first doped region, a second doped region, a third doped region and a fourth doped region formed in a surface of a well region, wherein the second doped region is completely separated from the third doped region by the well region;
      a gate oxide layer covering the surface of the well region;
      a first gate formed on the gate oxide layer and spanned over the first doped region and the second doped region, wherein the first gate is connected with the first word line;
      a second gate formed on the gate oxide layer and spanned over the third doped region and the fourth doped region, wherein the second gate is connected with the first word line;
      a third gate formed on the gate oxide layer and spanned over the second doped region and the third doped region, wherein the third gate is connected with the first antifuse control line; and
      a first metal layer connected with the first doped region through a first via and connected with the fourth doped region through a second via, wherein the first metal layer is the first bit line; and
   a second memory cell comprising:
      the fourth doped region, a fifth doped region, a sixth doped region and a seventh doped region formed in the surface of the well region, wherein the fifth doped region is completely separated from the sixth doped region by the well region;
      a fourth gate formed on the gate oxide layer and spanned over the fourth doped region and the fifth doped region, wherein the fourth gate is connected with the second word line;
      a fifth gate formed on the gate oxide layer and spanned over the sixth doped region and the seventh doped region, wherein the fifth gate is connected with the second word line;
      a sixth gate formed on the gate oxide layer and spanned over the fifth doped region and the sixth doped region, wherein the sixth gate is connected with the second antifuse control line; and
      the first metal layer connected with the seventh doped region through a third via.

6. The array structure as claimed in claim 5, wherein the gate oxide layer under the third gate is thinner than the gate oxide layer under the first gate, and the gate oxide layer under the third gate is thinner than the gate oxide layer under the second gate, wherein the gate oxide layer under the sixth gate is thinner than the gate oxide layer under the fourth gate, and the gate oxide layer under the sixth gate is thinner than the gate oxide layer under the fifth gate.

7. The array structure as claimed in claim 5, further comprising:
   a second metal layer, wherein the first gate and the second gate are connected with each other through the second metal layer; and
   a third metal layer, wherein the fourth gate and the fifth gate are connected with each other through the third metal layer.

8. The array structure as claimed in claim 5, wherein the first gate and the second layer are connected with each other through a first polysilicon layer, and the fourth gate and the fifth layer are connected with each other through a second polysilicon layer.

9. The array structure as claimed in claim 5, further comprising:
   a third memory cell comprising:
      an eighth doped region, a ninth doped region, a tenth doped region and an eleventh doped region formed in the surface of the well region, wherein the ninth doped region is completely separated from the tenth doped region by the well region;
      a seventh gate formed on the gate oxide layer and spanned over the eighth doped region and the ninth doped region, wherein the seventh gate is connected with the first word line;
      an eighth gate formed on the gate oxide layer and spanned over the tenth doped region and the eleventh doped region, wherein the eighth gate is connected with the first word line;
      a ninth gate formed on the gate oxide layer and spanned over the ninth doped region and the tenth doped region, wherein the ninth gate is connected with the first antifuse control line; and
      a fourth metal layer connected with the eighth doped region through a fourth via and connected with the eleventh doped region through a fifth via, wherein the fourth metal layer is a second bit line; and a fourth memory cell comprising:
  the eleventh doped region, a twelfth doped region, a thirteenth doped region and a fourteenth doped region formed in the surface of the well region, wherein the twelfth doped region is completely separated from the thirteenth doped region by the well region;
  a tenth gate formed on the gate oxide layer and spanned over the eleventh doped region and the twelfth doped region, wherein the tenth gate is connected with the second word line;
  an eleventh gate formed on the gate oxide layer and spanned over the thirteenth doped region and the fourteenth doped region, wherein the eleventh gate is connected with the second word line;
  a twelfth gate formed on the gate oxide layer and spanned over the twelfth doped region and the thirteenth doped region, wherein the twelfth gate is connected with the second antifuse control line; and the fourth metal layer connected with the fourteenth doped region through a sixth via.

* * * * *